United States Patent
Keelan et al.

(10) Patent No.: US 9,338,413 B2
(45) Date of Patent: May 10, 2016

(54) IMAGING SYSTEMS WITH IMAGE PIXELS HAVING ADJUSTABLE SPECTRAL RESPONSES

(71) Applicant: Semiconductor Components Industries, LLC, Phoenix, AZ (US)

(72) Inventors: Brian Keelan, Boulder Creek, CA (US); Brian Vaartstra, Nampa, ID (US); Jeffrey Mackey, Danville, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 154 days.

(21) Appl. No.: 14/090,876

(22) Filed: Nov. 26, 2013

(65) Prior Publication Data
US 2015/0146077 A1 May 28, 2015

(51) Int. Cl.
*H04N 9/04* (2006.01)
*H04N 5/369* (2011.01)
*H01L 27/146* (2006.01)
*G02F 1/01* (2006.01)
*G02F 1/15* (2006.01)

(52) U.S. Cl.
CPC ............... *H04N 9/045* (2013.01); *G02F 1/01* (2013.01); *H01L 27/14621* (2013.01); *H01L 27/14627* (2013.01); *H01L 27/14685* (2013.01); *H04N 5/3696* (2013.01); *G02F 2001/1517* (2013.01); *H04N 2209/043* (2013.01)

(58) Field of Classification Search
CPC ............... H04N 9/045; H04N 5/3696; H04N 2209/043; H04N 2209/045; H01L 27/14685; H01L 27/14621; H01L 27/14627
USPC .......................................... 348/342, 273, 340
See application file for complete search history.

(56) References Cited

U.S. PATENT DOCUMENTS

| | | | |
|---|---|---|---|
| 6,621,616 B1 | 9/2003 | Bauer et al. | |
| 2002/0003201 A1 | 1/2002 | Yu | |
| 2009/0121301 A1 | 5/2009 | Chang | |
| 2011/0242349 A1* | 10/2011 | Izuha | H01L 27/14621 348/222.1 |
| 2011/0285881 A1* | 11/2011 | Izuha | H04N 5/2254 348/279 |
| 2013/0182177 A1* | 7/2013 | Furlan | H04N 19/51 348/362 |
| 2014/0176781 A1* | 6/2014 | Zhang | H01L 27/14618 348/342 |

* cited by examiner

*Primary Examiner* — Nhan T Tran
(74) *Attorney, Agent, or Firm* — Treyz Law Group, P.C.; Kendall P. Woodruff

(57) ABSTRACT

An imaging system may include an image sensor having an array of image pixels. Some image pixels in the array may be provided with spectral response adjustment structures. For example, a plurality of broadband pixels in the array may include spectral response adjustment structures. The spectral response adjustment structures may be configured to narrow the spectral response of the broadband pixels in high light conditions. For example, the spectral response of the broadband pixels may transition from clear to gray, from clear to green, or from yellow to green as the light level increases. The spectral response adjustment structures may, for example, be formed from photochromic materials or electrochromic elements. Processing circuitry in the imaging system may generate a color correction matrix for an image based at least partly on the state of the spectral response adjustment structures.

23 Claims, 10 Drawing Sheets

IMAGING SYSTEMS WITH IMAGE PIXELS HAVING ADJUSTABLE SPECTRAL RESPONSES

BACKGROUND

This relates generally to imaging systems, and more particularly, to imaging systems that include image pixels with adjustable spectral responses.

Modern electronic devices such a cellular telephones, cameras, and computers often use digital image sensors. Imagers (i.e., image sensors) often include a two-dimensional array of image sensing pixels. Each pixel typically includes a photosensor such as a photodiode that receives incident photons (light) and converts the photons into electrical signals.

In some imaging systems, broadband pixels such as clear pixels and/or yellow pixels may be used to improve the signal-to-noise ratio (SNR) of an image sensor at lower exposure levels. For example, some imaging systems employ an image sensor having clear, red, and blue pixels, without any green pixels. In this type of imaging system, a green signal is determined based on a weighted subtraction of the red and blue signals from the clear signal. This approach has various advantages, such as high resolving power and freedom from chromatic aliasing and associated color artifacts.

However, conventional image sensors having clear pixels often experience negative effects at high light levels. For example, the higher sensitivity of the clear pixel may be nullified by shorter integration times that are required to avoid clipping. The red and blue exposures become shorter by a corresponding amount, which in turn results in reduced chromatic SNR. Additionally, conventional image sensors having clear pixels require a stronger color correction matrix (CCM) to convert RCB data to sRGB data, which can amplify noise and artifacts.

It would therefore be desirable to be able to provide imaging systems with improved signal-to-noise ratio and reduced amplification of noise and image artifacts.

DETAILED DESCRIPTION

Electronic devices such as digital cameras, computers, cellular telephones, and other electronic devices include image sensors that gather incoming light to capture an image. An image sensor may include an array of image pixels. Each image pixel may include a photosensitive element such as a photodiode that converts the incoming light into image signals. An image sensor may have any number of pixels (e.g., hundreds, thousands, millions or more). A typical image sensor may, for example, have hundreds of thousands or millions of pixels (e.g., megapixels).

Image sensors may include control circuitry such as circuitry for operating the image pixels, readout circuitry for reading out image signals corresponding to the electric charge generated by the photosensitive elements, and, if desired, other processing circuitry such as analog processing circuitry and digital processing circuitry. An image sensor may be coupled to additional processing circuitry such as circuitry on a companion chip to the image sensor, circuitry in the device that is coupled to the image sensor by one or more cables or other conductive lines, or external processing circuitry.

Figure 1:
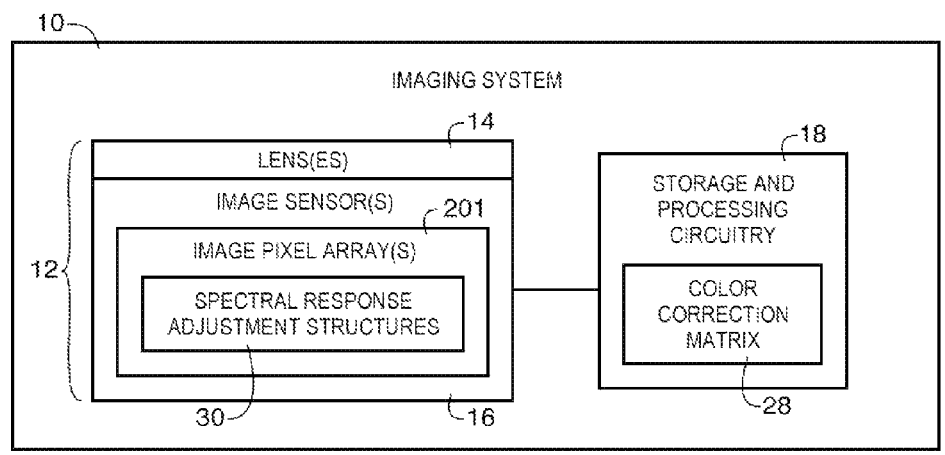
FIG. 1 is a diagram of an illustrative imaging system that may include an image sensor having an image pixel array with spectral response adjustment structures in accordance with an embodiment of the present invention.

FIG. 1 is a diagram of an illustrative electronic device that uses an image sensor to capture images. Imaging system 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 may include circuitry for converting analog pixel data into corresponding digital image data to be provided to processing circuitry 18. If desired, camera module 12 may be provided with an array of lenses 14 and an array of corresponding image sensors 16.

Image sensor 16 may include one or more arrays of image pixels such as image pixel array 201. Image pixel array 201 may include spectral response adjustment structures such as spectral response adjustment structures 30 that are configured to adjust the spectral response of one or more pixels in pixel array 201 during operation of image sensor 16. The spectral responses of pixels may be adjusted in response to information such as image information, camera metadata information, environmental information, exposing light level information, and/or user input information. For example, spectral response adjustment structures 30 may be configured to narrow the spectral response of one or more pixels in pixel array 201 in response to increasing intensity of light incident on pixel array 201.

If desired, spectral response adjustment structures 30 may adjust the spectral response of some pixels in array 201 while leaving the spectral response of other pixels in array 201 unadjusted. For example, pixel array 201 may include an array of red, blue, and broadband pixels (e.g., broadband pixels such as clear pixels and/or yellow pixels). Spectral response adjustment structures 30 may adjust the spectral response of the broadband pixels in array 201 while leaving the spectral response of the red and blue pixels in array 201 unadjusted. This type of arrangement may improve the signal-to-noise (SNR) ratio associated with image signals from the red and blue pixels. Narrowing the spectral response of broadband pixels at higher light levels may also allow the use of a milder color correction matrix (CCM), which in turn leads to reduced amplification of noise and artifacts.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12. For example, processing circuitry 18 may include circuitry that forms part of an integrated circuit that includes image sensor 16 and/or may include circuitry that forms part of an integrated circuit within module 12 that is associated with image sensor 16. Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Processing circuitry 18 may use a color correction matrix (CCM) such as CCM 28 to convert image data into standard R, G, and B values (e.g., sRGB) for a display. The values in CCM 28 may be determined based on the spectral characteristics of image sensor 16 (e.g., spectral characteristics of lens 14, spectral characteristics of filters in image sensor 16, the state of spectral response adjustment structures 30, etc.), based on lighting conditions such as light level and illuminant information (e.g., daylight, tungsten, fluorescent, etc.), and/ or based on other characteristics of the system or scene being captured. CCM 28 may also be used to correct for crosstalk and spectral overlap.

The "strength" of a CCM is indicated by the values on the diagonal of the matrix. A unit matrix with ones on the diagonal and zeros off-diagonal would make no correction; stronger corrections require larger positive values on the diagonal and more negative values off-diagonal. A conventional image sensor having clear pixels instead of green pixels requires a stronger CCM than a Bayer sensor in order to convert clear pixel signals to green pixel signals. As the strength of the CCM increases, it can amplify uncorrelated noise and certain artifacts within a system.

The use of spectral response adjustment structures 30 in image sensor 16 may allow CCM 28 to be "milder" than that of a typical image sensor with clear pixels (e.g., CCM 28 may have lower on-diagonal values than that of a typical image sensor with clear pixels). For example, spectral response adjustment structures 30 may adjust the spectral response of broadband pixels in high light levels to be closer to that of green pixels. This in turn means that the strength of corrections needed in CCM 28 may be reduced. Processing circuitry 18 may determine the values of CCM 28 based at least partly on the state of spectral response adjustment structures 30 (e.g., based on an amount by which spectral response adjustment structures 30 have adjusted the spectral response of pixels in array 201).

Figure 2:
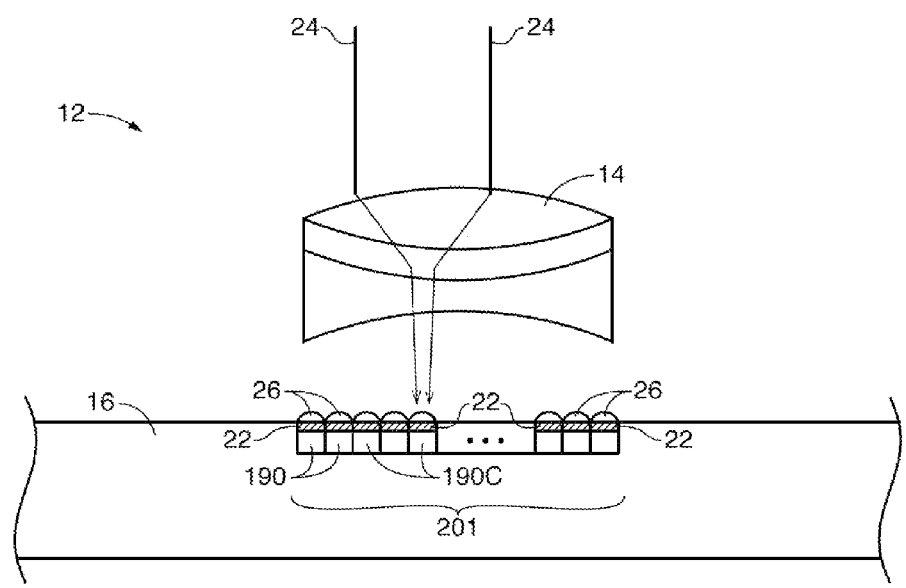
FIG. 2 is cross-sectional side view of an illustrative camera module having a lens that focuses image light onto an image pixel array in accordance with an embodiment of the present invention.

As shown in FIG. 2, image sensor 16 may include image pixel array 201 having an array of image sensor pixels 190 (sometimes referred to herein as image pixels 190). Array 201 may contain, for example, hundreds or thousands of rows and columns of image sensor pixels 190.

Image pixel array 201 may include an array of color filter elements such as color filter elements 22. Each color filter element 22 may be formed over a photosensitive element in an associated one of image pixels 190. The array of color filter elements 22 may be covered by a corresponding array of microlenses such as microlenses 26. Color filter elements 22 may include red color filter elements (e.g., color filter material that passes red light while reflecting and/or absorbing other colors of light), blue color filter elements (e.g., color filter material that passes blue light while reflecting and/or absorbing other colors of light), green color filter elements (e.g., color filter material that passes green light while reflecting and/or absorbing other colors of light), yellow color filter elements (e.g., yellow color filter material that passes red and green light), clear color filter elements (e.g., transparent material that passes red, blue, and green light), and/or color filter elements of other colors (e.g., cyan, magenta, etc.). If desired, some image pixels 190 may not include color filter elements. Image pixels that do not include color filter elements and image pixels that are provided with clear color filter elements may sometimes be referred to as clear pixels, white pixels, clear image pixels, or white image pixels.

Filter elements that pass two or more colors of light (e.g., two or more colors of light selected from the group that includes red light, blue light, and green light) are sometimes referred to herein as "broadband" filter elements. For example, yellow color filter elements that are configured to pass red and green light and clear color filter elements that are configured to pass red, green, and blue light may be referred to herein as broadband filter elements or broadband color filter elements. Similarly, image pixels that include a broadband color filter element (e.g., a yellow or clear color filter element) and that are therefore sensitive to two or more colors of light (e.g., two or more colors of light selected from the group that includes red light, blue light, and green light) may sometimes be referred to herein as broadband pixels or broadband image pixels. In contrast, "colored" pixel may be used herein to refer to image pixels that are primarily sensitive to one color of light (e.g., red light, blue light, green light, or light of any other suitable color).

Pixel array 201 may include one or more broadband pixels such as broadband pixels 190C. Broadband pixels 190C may be interspersed among colored pixels in array 201 in any suitable pattern. For example, pixel array 201 may have a Bayer-like pattern having broadband pixels in the place of green pixels. This type of color filter pattern is sometimes referred to as RCCB, as each unit pixel may have a red subpixel, two clear broadband subpixels, and a blue subpixel. This is, however, merely illustrative. If desired, any other suitable pattern may be used.

Spectral response adjustment structures 30 (FIG. 1) may be located in all pixels 190 or may be located only in a group of pixels 190 such as broadband pixels 190C. In another suitable arrangement, spectral response adjustment structures 30 may be located in all pixels 190 but may only be active in broadband pixels 190C. Spectral response adjustment structures 30 may be configured to adjust the spectral response of broadband pixels 190C based on the intensity of incident light 24. For example, when the intensity of incident light 24 is high (e.g., above a threshold intensity), spectral response adjustment structures 30 may narrow the spectral response of broadband pixels 190C (e.g., may adjust the spectral response of broadband pixels 190C to be closer to that of a green pixel). When the intensity of incident light 24 is low (e.g., below a threshold intensity), spectral response adjustment structures 30 may leave the spectral response of broadband pixels 190C unadjusted or, in cases where the spectral response is in a narrowed state, may increase the spectral response to be equivalent to a broadband pixel. In some configurations, the spectral response of broadband pixels 190C may vary continuously as the light level changes. In configurations where spectral response adjustment structures 30 are located in colored pixels 190 (e.g., in red and/or blue pixels), the spectral response of colored pixels 190 may be adjusted based on illuminant color temperature (as an example).

Figure 8:
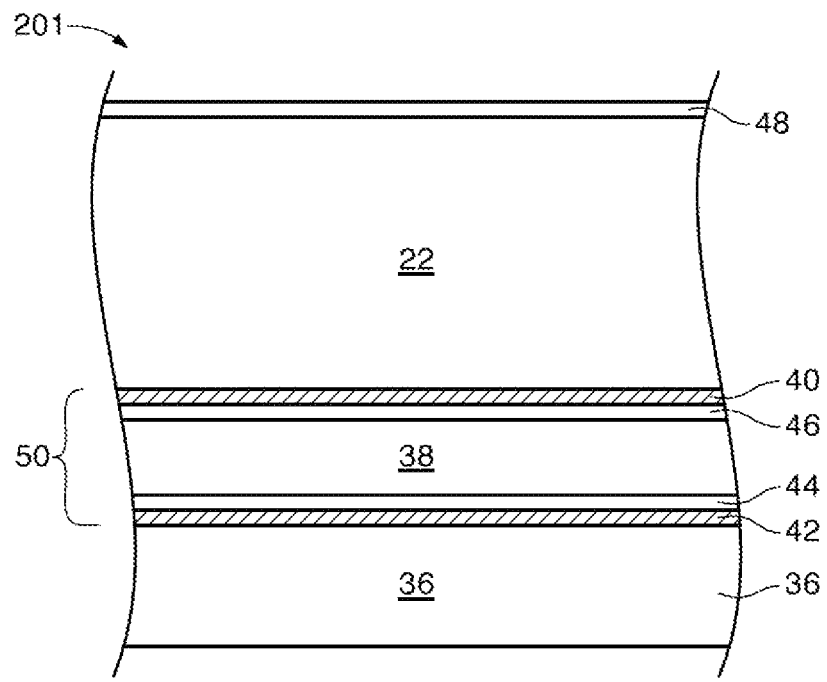
FIG. 8 is a cross-sectional side view of a portion of an illustrative image pixel array having spectral response adjustment structures such as electrochromic elements that are formed below a color filter array in accordance with an embodiment of the present invention.
Figure 9:
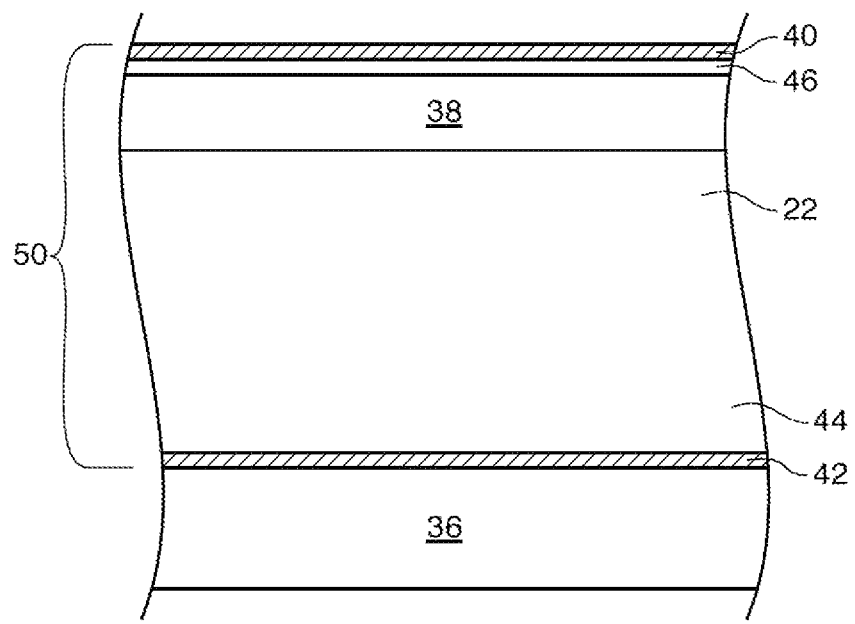
FIG. 9 is a cross-sectional side view of a portion of an illustrative image pixel array having spectral response adjustment structures such as electrochromic elements that are incorporated into a color filter array in accordance with an embodiment of the present invention.
Figure 10:
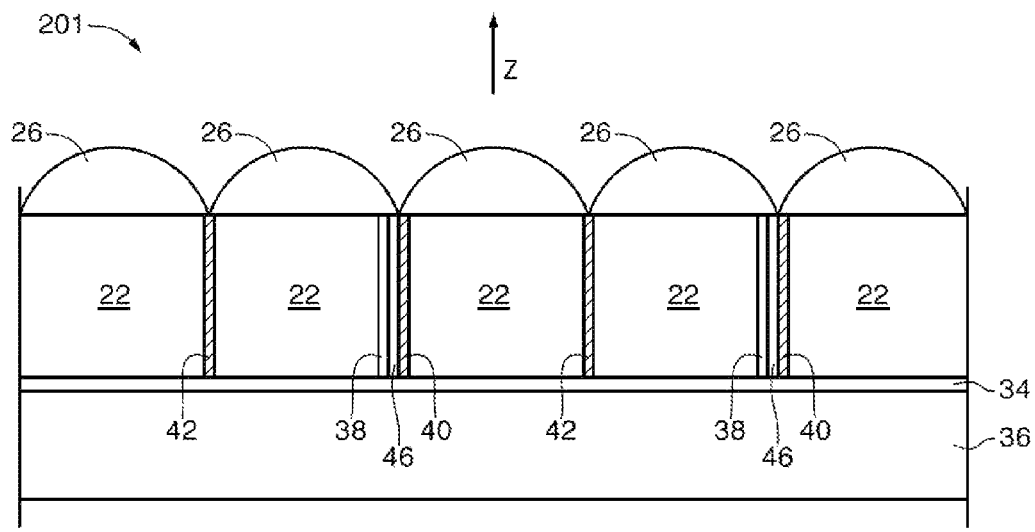
FIG. 10 is a cross-sectional side view of a portion of an illustrative image pixel array having spectral response adjustment structures such as electrochromic elements having vertically oriented electrodes that form sidewalls between adjacent color filter elements in accordance with an embodiment of the present invention.

Spectral response adjustment structures 30 may be incorporated into microlenses 26, may be incorporated into color filter elements 22, may be formed above color filter elements 22, or may be formed below color filter elements 22. Different kinds of elements may be used to form spectral response adjustment structures 30. FIGS. 3-7 illustrate embodiments in which spectral response adjustment structures 30 are formed from a photochromic material with a spectral response that changes according to a level of light incident on the photochromic material. FIGS. 8-10 illustrate embodiments in which spectral response adjustment structures 30 are formed from electrochromic elements with a spectral response that changes based on changes in the surrounding electrical environment.

Figure 3:
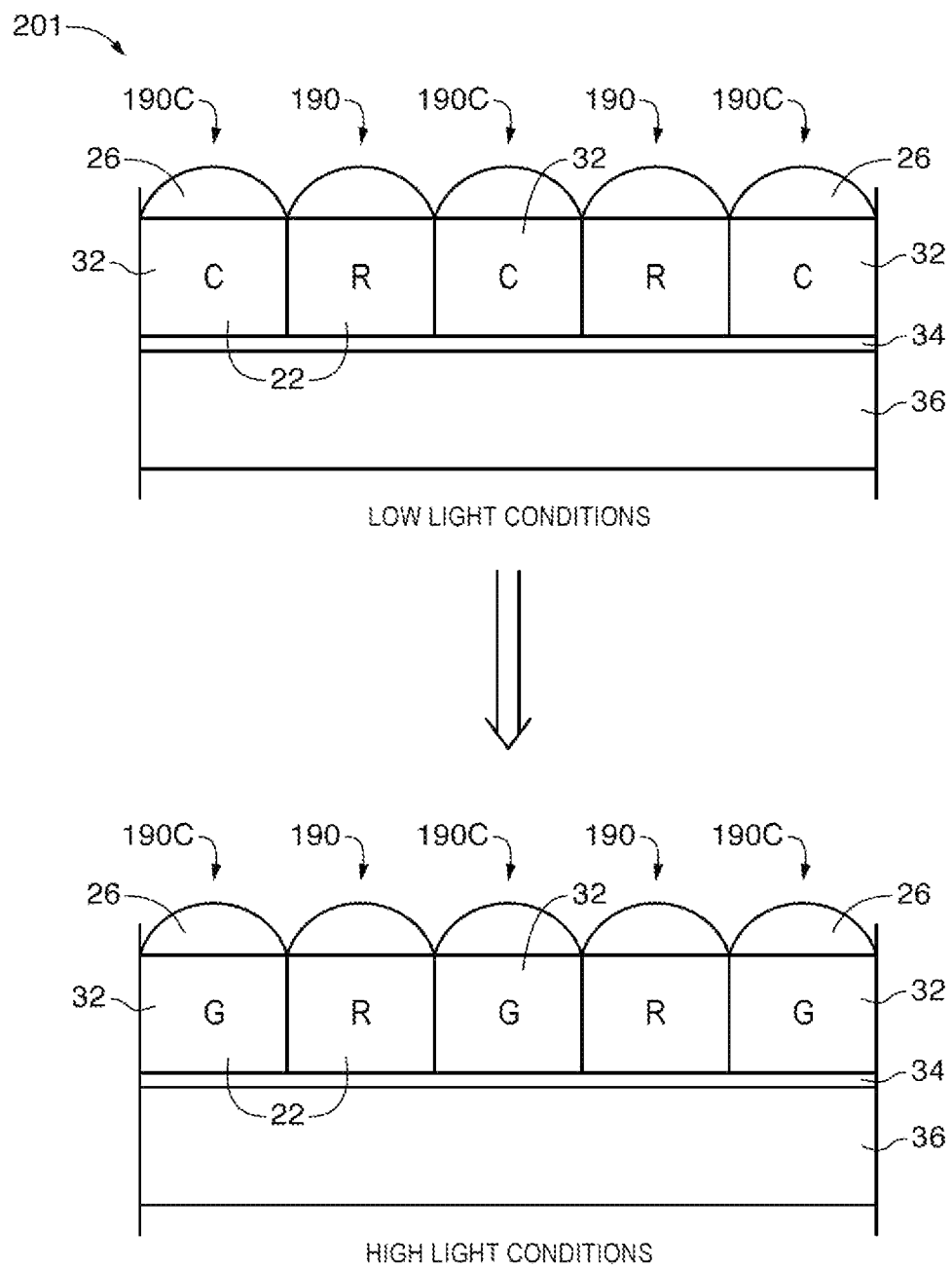
FIG. 3 is a cross-sectional side view of an illustrative image pixel array having spectral response adjustment structures such as a photochromic material that is incorporated into color filter elements in a color filter array in accordance with an embodiment of the present invention.

FIG. 3 is a cross-sectional side view of an illustrative image pixel array having spectral response adjustment structures such as a photochromic material that is incorporated into color filter elements in a color filter array. As shown in FIG. 3, pixel array 201 may include an array of image pixels 190 formed in a substrate such as substrate 36 (e.g., a silicon image sensor substrate). If desired, a passivation layer such as passivation layer 34 may be interposed between substrate 36 and pixels 190.

A photochromic material such as photochromic material 32 may be incorporated into color filters 22 of broadband pixels 190C. Photochromic material 32 may be configured to change color in response to incident light. For example, photochromic material 32 may be clear during low light conditions (as shown in the upper portion of FIG. 3) but may be green during high light conditions (as shown in the lower portion of FIG. 3). This reduces the sensitivity of broadband pixels 190C during high light conditions so that exposure times for red and blue pixels can be as long as needed without overexposing broadband pixels 190C. Additionally, by adjusting the spectral response of color filter 22 during high light conditions to be closer to that of a green color filter, a milder color correction matrix 28 (FIG. 1) may be used to convert broadband pixel data from broadband pixels 190C to green pixel data.

This is, however, merely illustrative. If desired, photochromic material 32 may be clear during low light conditions and gray during high light conditions. In both cases, the reduction in broadband pixel sensitivity during high light conditions may improve the SNR associated with red and blue pixel data. In general, photochromic material 32 may be configured to undergo any suitable color transition (e.g., yellow to green, clear to cyan, etc.). Configurations in which photochromic material 32 changes from clear to green (e.g., changes from transmitting all colors of light to filtering out red and blue light) are sometimes described herein as an example.

Photochromic material 32 may be formed from any suitable material or combination of materials exhibiting photochromism. In one suitable embodiment, spiropyran or spirooxazine may be doped into a silicon-containing and/or a zirconium-containing matrix. The resulting dye-doped matrices may be configured to exhibit strong coloration under ultraviolet (UV) light exposure and fast thermal bleaching when the UV light is removed. In another suitable embodiment, photochromic material may be formed from a bisamidazole derivative that displays photochromic clear-to-blue transition by reversible bond cleavage upon UV light irradiation and that returns to clear by fast thermal bleaching within tens of milliseconds at room temperature. Photochromic material 32 may include photochromic elements suspended in a polymer matrix or a photoresist material. The material may, for example, be spin-coated onto an image sensor substrate and subsequently patterned using photolithography techniques.

If desired, a colored pigment or dye may be added to photochromic material 32 to help control the change in spectral characteristics (e.g., the spectral transmittance) of photochromic material 32. For example, photochromic material 32 may include photochromic elements that change color in response to incident light and a yellow pigment or dye. The photochromic elements may be configured to change from clear to green or from clear to cyan as light levels increase. The yellow pigment or dye may be configured to filter blue light such that the combined effect of the photochromic elements and yellow pigment or dye is to filter out red and blue light during high light conditions. This is, however, merely illustrative. If desired, pigment or dye of other suitable colors or no pigment or dye at all may be incorporated into photochromic material 32.

The spectral characteristics of photochromic material 32 may change in response to visible light only, in response to UV light only, or in response to the combined intensity of visible and UV light. As used herein, "high light conditions" may refer to a level of visible light that exceeds a threshold, a level of UV light that exceeds a threshold, or a level of combined visible and UV light that exceeds a threshold. Similarly, "low light conditions" may be used herein to refer to a level of visible light below a threshold, a level of UV light below a threshold, or a level of combined visible and UV light below a threshold.

During operation of image sensor 16, processing circuitry 18 may be configured to determine the state of photochromic material 32 in order to adjust CCM 28 as needed based on changes in the spectral response of broadband pixels 190C. For example, in configurations where image sensor 16 operates in video mode, processing circuitry 18 may use image data from one or more previous frames (e.g., an average of previous frames) to determine the state of photochromic material 32. As another example, photochromic material 32 may be configured to change state in response to a known change in light level (e.g., 2×, 5×, 6×, 8×, etc.) and/or may have a known state below or above a predetermined threshold of illumination (e.g., photochromic material 32 may be clear below an illumination threshold of 100 Lux). In other configurations, photochromic material 32 may exhibit a continuous coloration (which may or may not be linear) as light intensity increases and a continuous reduction in coloration as light intensity decreases.

Photochromic material 32 may be located in any suitable location in pixel array 201. In the illustrative example of FIG. 3, photochromic material 32 has been incorporated into color filter elements 22 of broadband pixels 190C. The incorporation of photochromic material 32 into color filter elements 22 may reduce the total transmission of light through filter 22 in high light conditions (i.e., color filter 22 may transition from clear to gray) or may reduce red and blue light transmission through filter 22 in high light conditions (i.e., color filter 22 may transition from clear to green).

Figure 4:
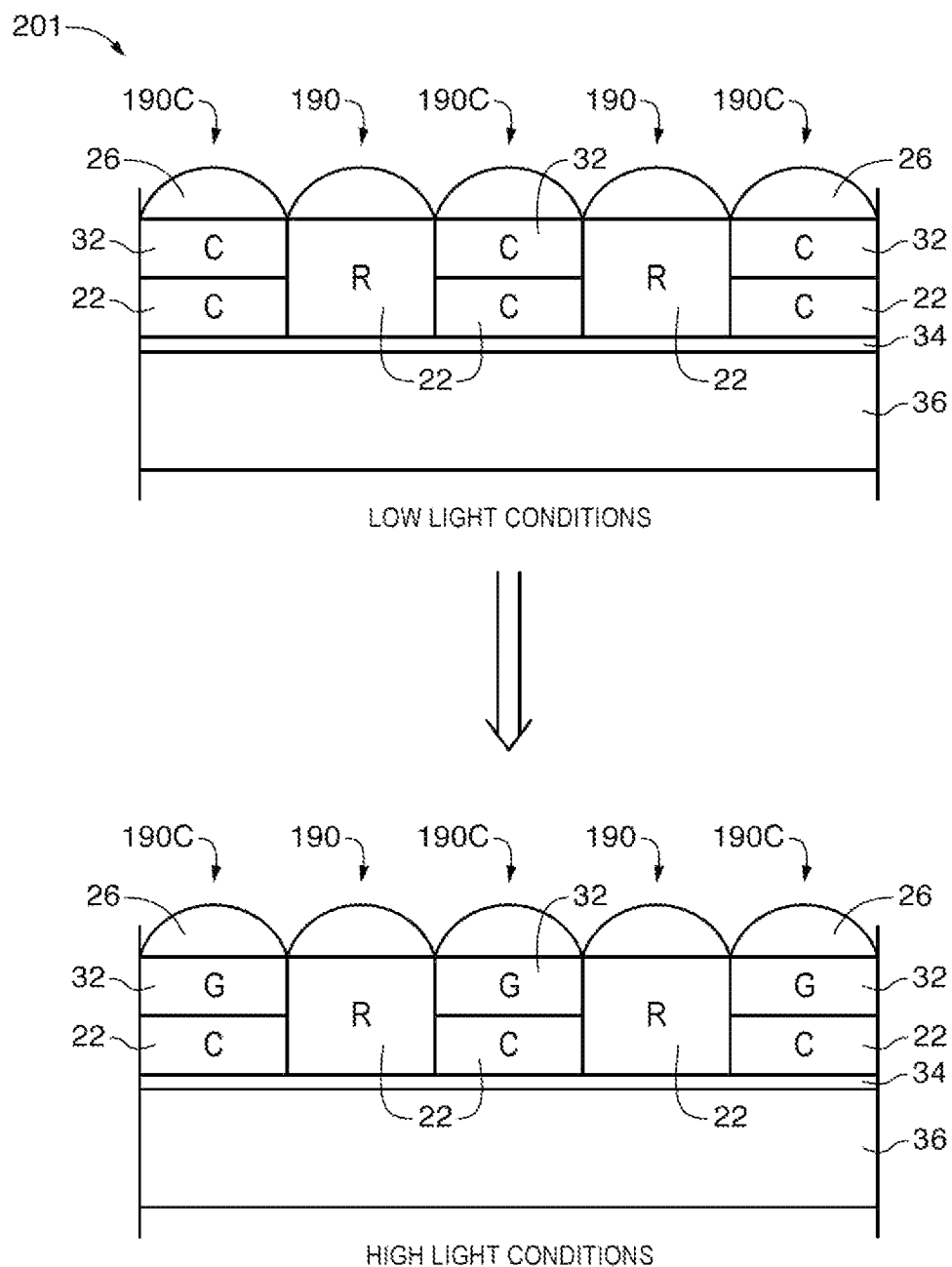
FIG. 4 is a cross-sectional side view of an illustrative image pixel array having spectral response adjustment structures such as a photochromic material that is formed above color filter elements in a color filter array in accordance with an embodiment of the present invention.

FIG. 4 illustrates an arrangement in which photochromic material 32 is formed as a separate material that sits above color filter elements 22 of broadband pixels 190C. As shown in FIG. 4, each broadband pixel 190C includes a layer of photochromic material 32 interposed between microlens 26 and broadband color filter element 22. During high light conditions (shown in the bottom portion of FIG. 4), incoming light may be attenuated by photochromic material 32 before it strikes color filter 22 of broadband pixels 190C. Photochromic material 32 may be configured to reduce the total transmission of light through photochromic material 32 in high light conditions (i.e., photochromic material 32 may transition from clear to gray) or to reduce red and blue light transmission through photochromic material 32 in high light conditions (i.e., photochromic material 32 may transition from clear to green).

Figure 5:
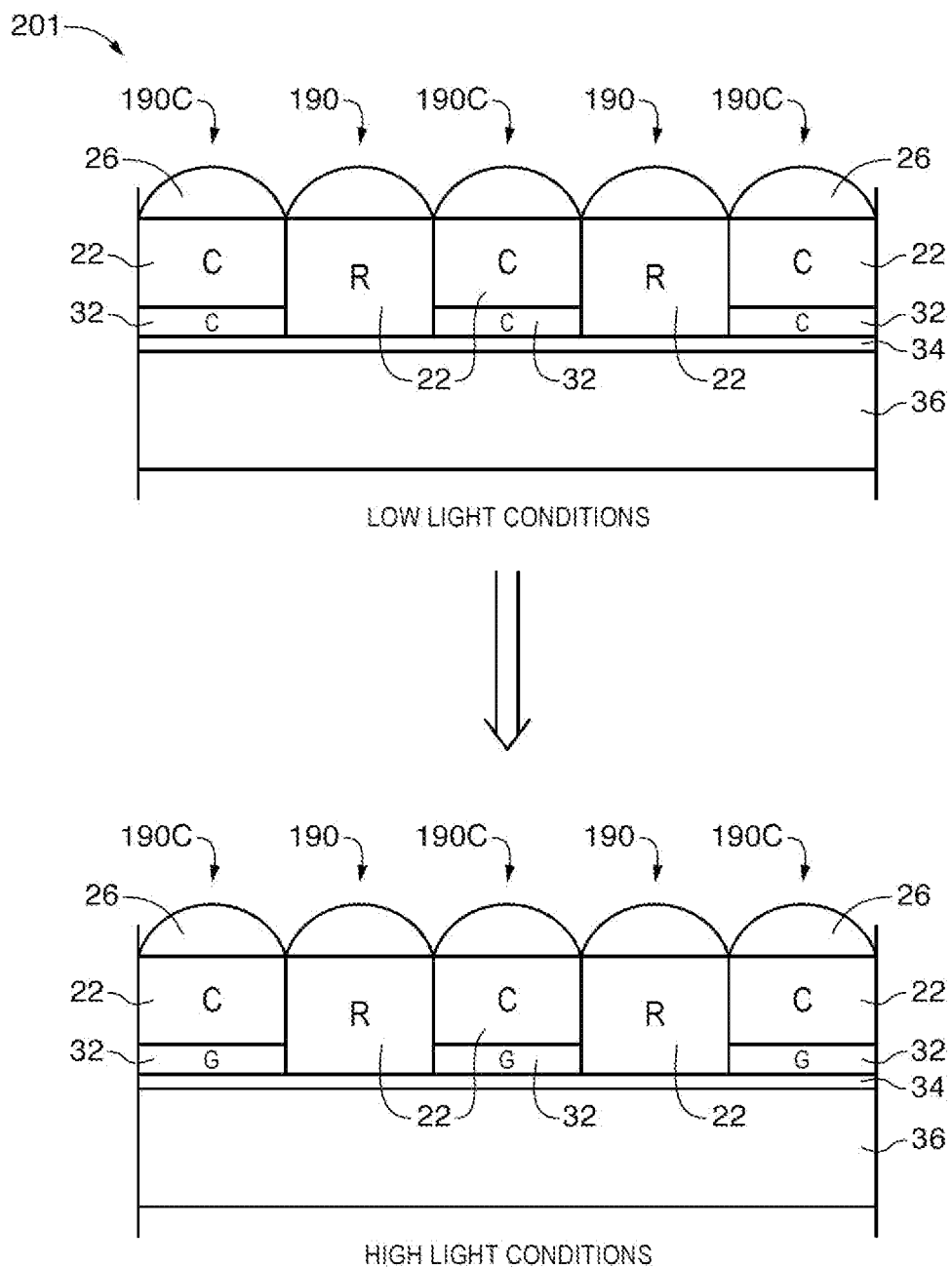
FIG. 5 is a cross-sectional side view of an illustrative image pixel array having spectral response adjustment structures such as a photochromic material that is formed below color filter elements in a color filter array in accordance with an embodiment of the present invention.

FIG. 5 illustrates an arrangement in which photochromic material 32 is formed as a separate material that sits below color filter elements 22 of broadband pixels 190C. As shown in FIG. 5, each broadband pixel 190C includes a layer of photochromic material 32 interposed between broadband color filter element 22 and substrate 36. During high light conditions (shown in the bottom portion of FIG. 5), the intensity of incoming light may be attenuated by photochromic material 32 after it passes through color filter 22 of broadband pixels 190C. Photochromic material 32 may be configured to reduce the total transmission of light through photochromic material 32 in high light conditions (i.e., photochromic material 32 may transition from clear to gray) or to reduce red and blue light transmission through photochromic material 32 in high light conditions (i.e., photochromic material 32 may transition from clear to green).

Figure 6:
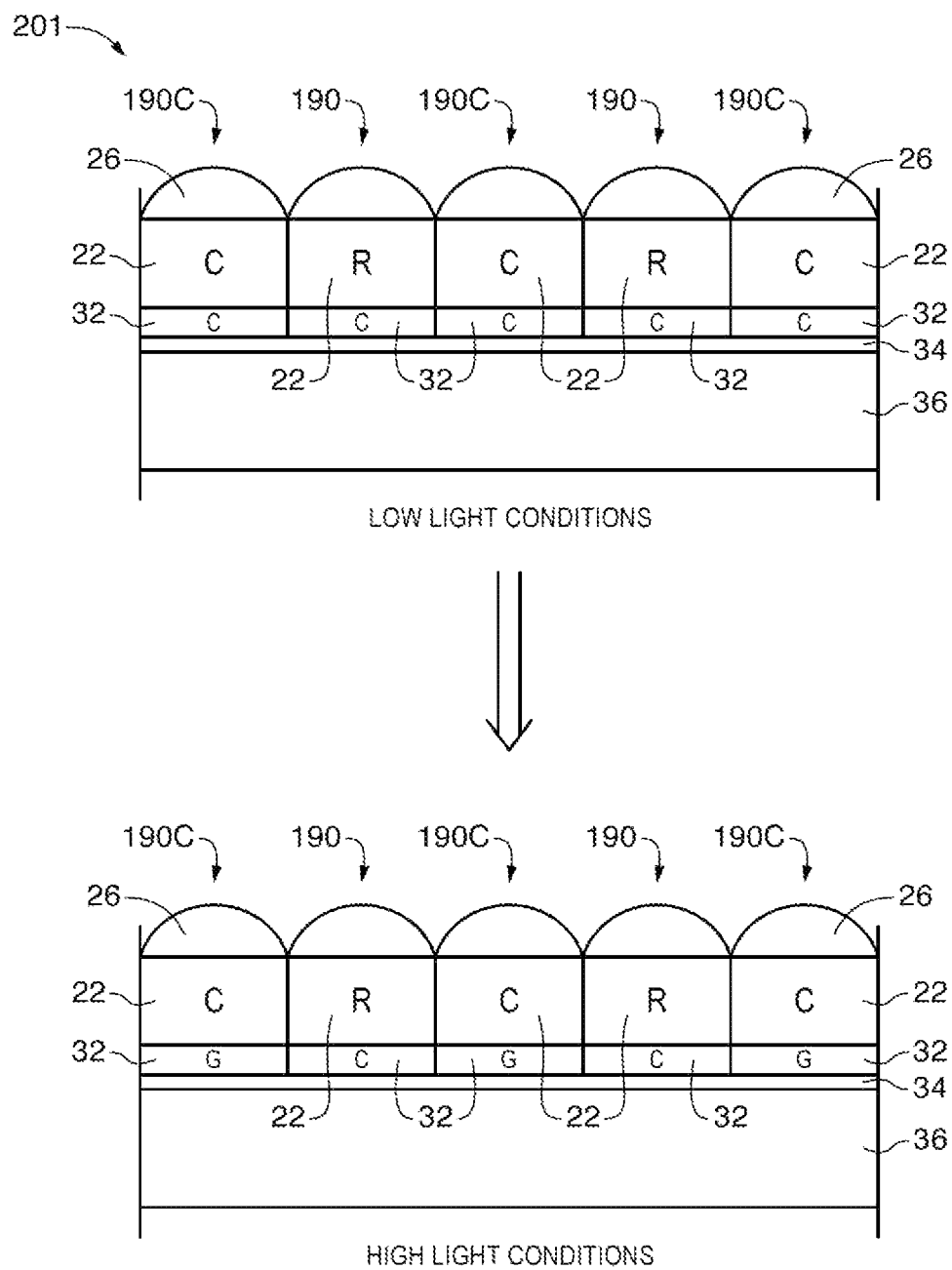
FIG. 6 is a cross-sectional side view of an illustrative image pixel array having spectral response adjustment structures such as a photochromic material that is formed in a contiguous layer below a color filter array in accordance with an embodiment of the present invention.

FIG. 6 illustrates an arrangement in which photochromic material 32 is formed as a separate material that sits below color filter elements 22 of all pixels 190 in array 201. As shown in FIG. 6, photochromic material 32 forms a contiguous, uniform layer that spans across the array, interposed between color filter elements 22 and substrate 36. In this type of configuration, the portions of photochromic material 32 that lie below broadband color filters 22 of broadband pixels 190C may exhibit changes in spectral characteristics in high light conditions (e.g., red and blue light transmission through photochromic material 32 in broadband pixels 190C may be reduced). The portions of photochromic material 32 that lie below color filters 22 of color pixels 190 (e.g., below red and/or blue color filters 22) may remain clear during high light conditions, as shown in the lower portion of FIG. 6. If desired, photochromic material 32 may be sensitive to green light only to ensure that the portions of photochromic material 32 located in color pixels such as red and blue pixels does not change the spectral response of the red and blue pixels.

Figure 7:
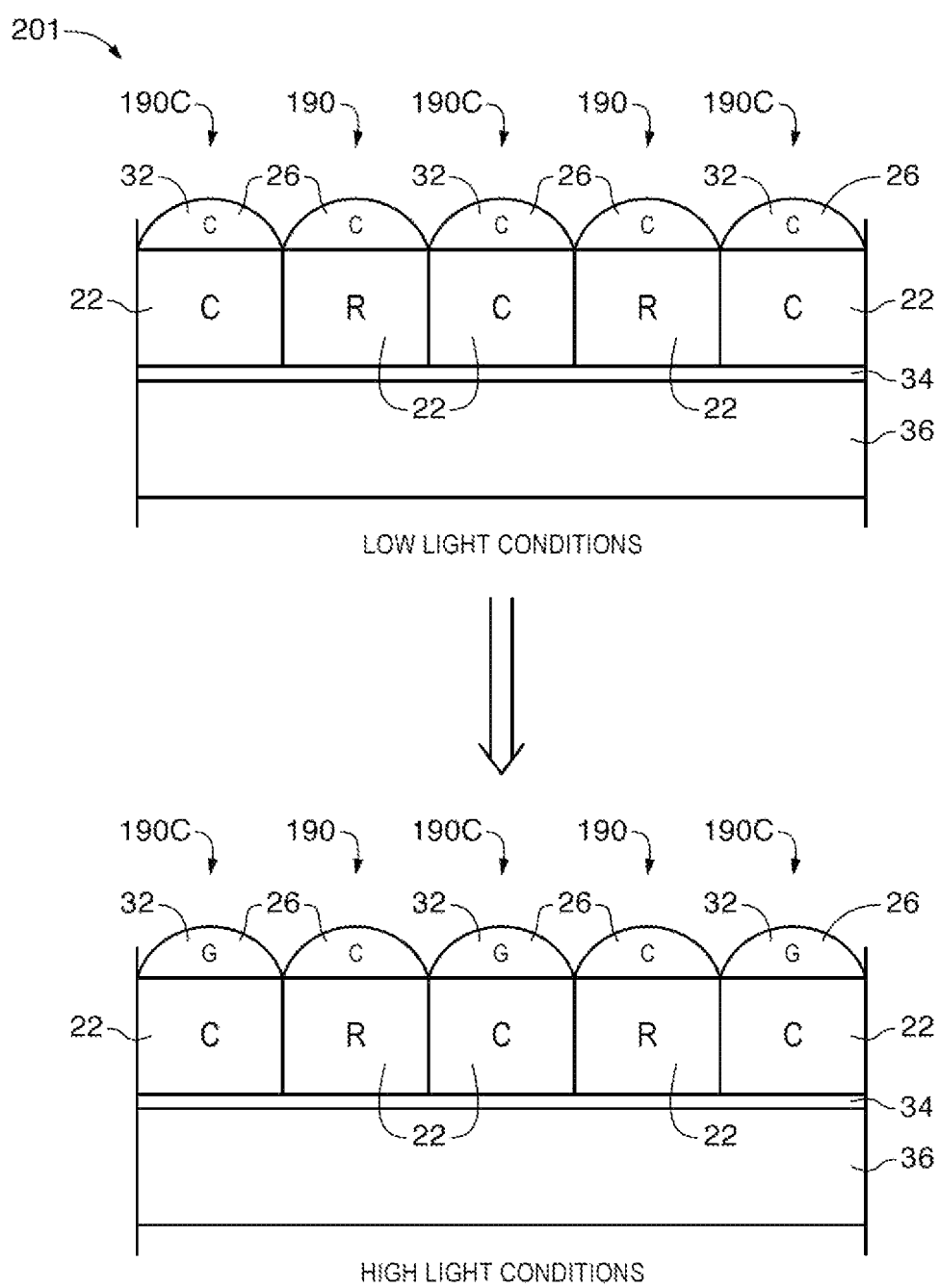
FIG. 7 is a cross-sectional side view of an illustrative image pixel array having spectral response adjustment structures such as a photochromic material that is incorporated into microlenses of a microlens array in accordance with an embodiment of the present invention.

FIG. 7 illustrates an arrangement in which photochromic material 32 is incorporated into microlenses 26 of broadband pixels 190C in pixel array 201. With this type of arrangement, microlenses 26 of broadband pixels 190C may include both microlens material and photochromic elements. If desired, microlenses 26 of color pixels 190 (e.g., red and blue pixels) may not include photochromic elements to ensure that the spectral response of red and blue pixels does not change. During high light conditions (shown in the bottom portion of FIG. 7), the intensity of incoming light may be attenuated by photochromic material 32 in microlenses 26 before it passes through color filters 22 of broadband pixels 190C. Photochromic material 32 in microlenses 26 of broadband pixels 190C may be configured to reduce the total transmission of light through photochromic material 32 in high light conditions (i.e., photochromic material 32 may transition from clear to gray) or may be configured to reduce red and blue light transmission through photochromic material 32 in high light conditions (i.e., photochromic material 32 may transition from clear to green).

If desired, spectral response adjustment structures 30 may be formed from electrochromic elements that change properties in response to changes in the surrounding electrical environment. This type of configuration is shown in FIG. 8. As shown in FIG. 8, pixel array 201 may include spectral response adjustment structures such as electrochromic elements 50. Electrochromic elements 50 (sometimes referred to as chromogenic elements) may be interposed between color filter elements 22 in pixel array 201. Electrochromic elements may include an electrolyte layer such as electrolyte layer 38 interposed between first and second electrodes such as upper electrode 40 and lower electrode 42. Electrolyte layer 38 may include an ion-conducting electrolyte. A chromophore layer such as chromophore-containing film layer 44 may be interposed between electrolyte layer 38 and lower electrode 42. Chromophore layer 44 may, for example, be formed from a liquid gel or a solid matrix containing a chromophore. An ion-donating film such as ion-donating film 46 may be interposed between electrolyte layer 38 and upper electrode 40. Ion-donating film 46 may be configured to behave analogously to a transistor source, but may supply ionic species rather than electrons.

During operation of image sensor 16, a voltage may be applied across electrodes 40 and 42 to instigate ionic transfer between ionic donor film 46 and chromophore layer 44. Ionic transfer between ionic donor film 46 and chromophore layer 44 causes changes in the band gap between the highest occupied and the lowest unoccupied molecular orbital of the chromophore, which in turn results in a spectral shift.

Illustrative examples of transparent conductors that may be used to form electrodes 40 and 42 include indium tin oxide (ITO), fluorine-doped tin oxide (FTO), doped zinc oxide, other suitable transparent conductive materials, or a combination of these transparent conductive materials. Conductors 40 and 42 may be patterned such that electrochromic elements 50 in different pixels be controlled individually. For example, during high light conditions, image sensor circuitry (e.g., circuitry 18 of FIG. 1) may apply a voltage to electrochromic elements 50 in broadband pixels 190C to narrow the spectral response of broadband pixels 190C, whereas electrochromic elements 50 in color pixels 190 (e.g., red and blue pixels) may not receive an applied voltage so that the spectral responses of red and blue pixels 190 remain unchanged by electrochromic elements 50. In another suitable embodiment, electrochromic elements 50 may only be formed in broadband pixels 190C to ensure that the spectral responses of red and blue pixels 190 remains unchanged.

Illustrative examples of chromophores that may be used in chromophore layer 44 include cyanophenyl-substituted 4,4'-bipyridine, osmium-coordinated 2,2'-bipyridine, lutetium bis (phthalocyanine), Prussian Blue ($C_{18}Fe_7N_{18}$), and electrochromic polymers (e.g., ECP-Green). Each of these chromophore systems may be configured to produce green coloration in response to an applied voltage.

FIG. 9 illustrates an example in which electrochromic elements 50 are incorporated into color filter elements 22 of pixel array 201. For example, chromophore layer 44 may be incorporated into color filter elements 22 to form a chromophore-laced color filter element. The operation of electrochromic elements 50 of FIG. 9 is similar to that of FIG. 8. During operation of image sensor 16, a voltage may be applied across electrodes 40 and 42 to instigate ionic transfer between ionic donor film 46 and chromophore layer 44 (e.g., chromophores in chromophore-laced color filter element 22). Ionic transfer between ionic donor film 46 and chromophore layer 44 causes changes in the band gap between the highest occupied and the lowest unoccupied molecular orbital of the chromophore, which in turn results in a spectral shift.

The example of FIGS. 8 and 9 in which the electrodes are horizontal and are oriented parallel to the upper and lower surfaces of color filter element 22 is merely illustrative. If desired, other suitable arrangements may be used. For example, as shown in FIG. 10, electrodes 40 and 42 may be oriented perpendicular to the upper and lower surface of color filter element 22. In other words, electrodes 40 and 42 may be oriented parallel to the optical axis of image sensor 16 (e.g., parallel to the z-axis of FIG. 10). Electrodes that are arranged vertically in this way (e.g., oriented vertically with respect to the upper surface of substrate 36) may, if desired, form sidewalls or may be integrated into sidewalls that are interposed between adjacent color filter elements 22. As shown in FIG. 10, color filter elements 22 that have been combined with chromophore layer 44 may be interposed between a respective pair of conductive plates 40 and 42, and conductive plates 40 and 42 may control the operation of ionic donor film 46, electrolyte layer 38, and chromophore layer 44 in the color filter element. In this type of scenario, conductive plates 40 and 42 need not be transparent. For example, conductive sidewalls 40 and 42 may be formed from ceramic or metal such as titanium nitride, tungsten, anodized aluminum, copper, other suitable materials, or a combination of these materials.

If desired, electrolyte layer 38 and ionic donor film 46 may be omitted. For example, color filter 22 may be combined with a chromophore having a transmission spectrum that changes in response to an applied voltage across electrodes 40 and 42. In this type of configuration, electrolyte layer 38 and ionic donor film 46 may be omitted, and chromophore-laced color filter element 22 may be interposed directly between electrodes 40 and 42.

The examples of FIGS. 3-10 in which spectral response adjustment structures 30 are formed from photochromic or electrochromic elements are merely illustrative. If desired, other techniques may be employed to adjust the responsivity of one or more pixels or groups of pixels in pixel array 201. For example, the layers between upper electrode 40 and lower electrode 42 of FIG. 9 may be replaced by a polymer-dispersed liquid crystal (PDLC) material. The transmission of light through the PDLC material may be controlled by the applied voltage between the electrodes. In another suitable arrangement, the PDLC material may be incorporated into one or more color filter elements 22, and the PDLC-controlling electrodes may form sidewalls or may be integrated with sidewalls on opposing sides of the color filter element. If desired, other suitable alignment-based technologies may be used.

Figure 11:
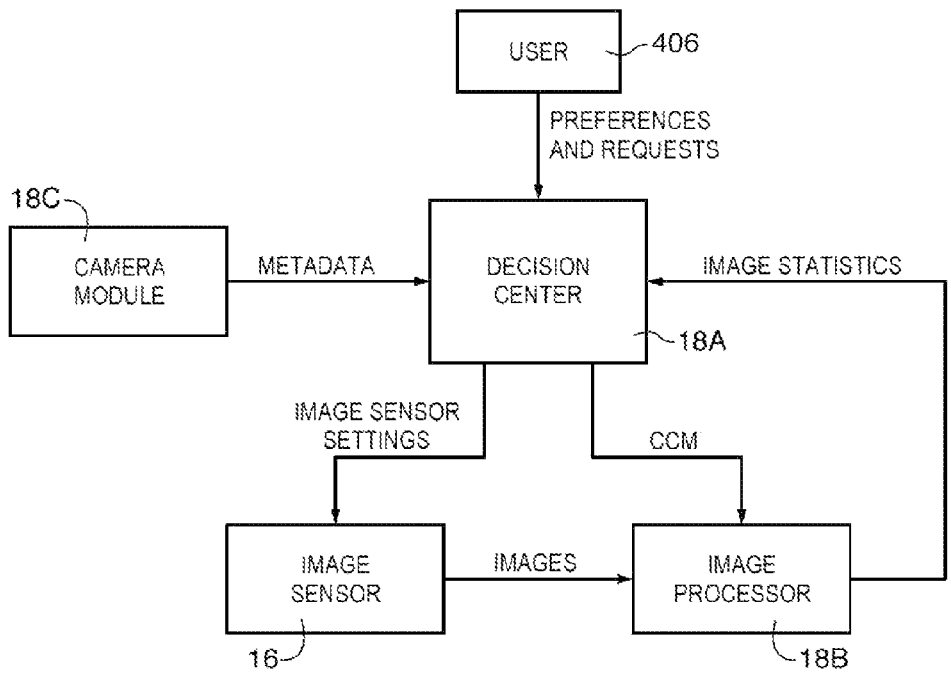
FIG. 11 is a diagram illustrating how processing circuitry gathers various inputs to determine image sensor settings and a color correction matrix that optimize image quality for an image sensor having spectral response adjustment structures in accordance with an embodiment of the present invention.

FIG. 11 is a diagram illustrating how processing circuitry gathers various inputs to determine image sensor settings and a color correction matrix that optimize image quality for an image sensor having spectral response adjustment structures. As shown in FIG. 11, a decision center such as decision center 18A may gather information from user 406, image processor 18B, and camera controller 18C. Decision center 18A may output information and instructions to image sensor 16 and image processor 18B based on the gathered information. If desired, decision center 18A, image processor 18B, and camera controller 18C may be implemented as part of storage and processing circuitry 18 of FIG. 1.

User 406 may supply preferences that may be used in customized decision-making and/or may provide requests that directly control image sensor and/or image processor behavior, bypassing or deterministically driving decision center 18A. Camera controller 18C may send metadata information to decision center 18A. Metadata information may include light level information (e.g., an inferred light level), integration time, flash firing information, etc. Image processor 18B may send image statistics to decision center 18A (e.g., image statistics derived from one or more recently captured image frames provided to image processor 18B from image sensor 16). Image statistics may include, for example, scene histograms, signal-to-noise ratio information, and illuminant information (e.g., an inferred capture illuminant such as D65, fluorescent light, etc.).

Based on this gathered information, decision center 18A may provide output settings to image sensor 16 and a CCM such as CCM 28 (FIG. 1) to image processor 18B. Output settings may, for example, include control signals for controlling the operation of spectral response adjustment structures 30. For example, in configurations where spectral response adjustment structures 30 are firmed from electrochromic elements 50, output settings may include voltages to be applied to the electrodes in electrochromic elements 50 based on the inferred light level. CCM 28 may be used by image processor 18B to convert image data from image sensor 16 into a standard format for a display (e.g., sRGB).

Figure 12:
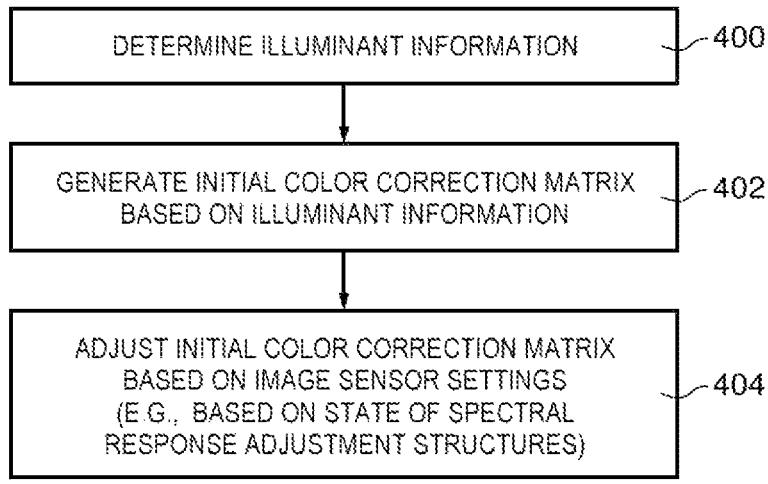
FIG. 12 is a flow chart of illustrative steps involved in determining a color correction matrix for an image sensor having spectral response adjustment structures based on illuminant information and image sensor settings in accordance with an embodiment of the present invention.

FIG. 12 is a flow chart of illustrative steps involved in determining a color correction matrix for an image sensor having spectral response adjustment structures.

In general, a "color-accurate" CCM may be defined as one that minimizes an objective color error in a defined color space over a set of test colors. A CCM (e.g., CCM 28 of FIG. 1) is typically a function of the spectral responses of the image sensor channels (e.g., a red channel, a blue channel, and a broadband channel); the spectral power distribution of the capture illuminant; and the transmittance spectra of any optical elements in the system such as infrared cutoff filters, which is typically invariant for a particular camera module design.

At step 400, processing circuitry 18 may determine illuminant information for an image frame based on image statistics (e.g., based on image statistics provided from image processor 18B to decision center 18A of FIG. 11). For example, a capture illuminant may be estimated based on the white balance gains that are inferred as part of image processing. This is, however, merely illustrative. If desired, a capture illuminant may be estimated by other suitable means (e.g., using other types of image statistics, information from separate ambient light sensors, etc.).

At step 402, processing circuitry 18 may generate an initial CCM based on the illuminant information. For example, processing circuitry 18 may use the inferred illuminant from step 400 in a look-up procedure to generate the initial CCM. The initial CCM may, for example, represent the most color-accurate CCM for an image sensor that does not include spectral response adjustment structures 30 or for an image sensor in which spectral response adjustment structures 30 are disabled.

At step 404, processing circuitry 18 may adjust the initial CCM based on image sensor settings. For example, processing circuitry 18 may adjust the initial CCM based on the state of spectral response adjustment structures 30 (e.g., based on an amount by which the spectral response of broadband pixels 190C is adjusted). In configurations where spectral response adjustment structures 30 are formed from photochromic material, the state of the photochromic material may be determined based on image data from one or more previous image frames (e.g., based on an average of previous frames), may be determined based on a change in light level, may be determined based on whether or not illumination levels fall above or below an illumination threshold, etc. In configurations where spectral response adjustment structures 30 are formed from electrochromic elements, the state of the electrochromic elements may be determined based on the voltages applied to the electrodes in the electrochromic elements. If desired, processing circuitry 18 may use one or more look-up tables or equations to determine the amounts by which the values in the initial CCM should be changed based on the state of spectral response adjustment structures 30.

In some situations, it may be desirable to select a CCM that minimizes error in color reproduction. In other situations, it may be desirable to optimize overall image quality, balancing degradations in multiple aspects of image quality. The presence of spectral response adjustment structures 30 in image sensor 16 means that the spectral response of one or more channels is varied. This introduces secondary changes in exposure, integration time, and CCM, which in turn can affect color accuracy, visual SNR, and visibility of chromatic and motion artifacts. In some cases, overall image quality may be improved by sacrificing some color reproduction accuracy. For example, at lower light levels where SNR is decreased, it may improve overall image quality to decrease color saturation slightly, reducing the amplification of noise by the CCM.

Figure 13:
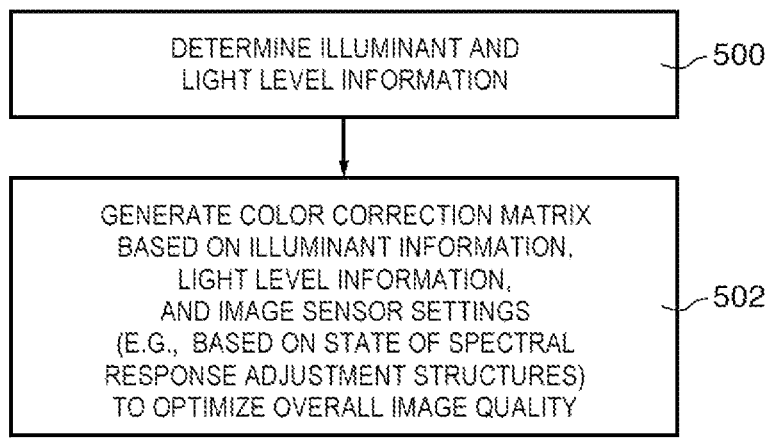
FIG. 13 is a flow chart of illustrative steps involved in determining a color correction matrix for an image sensor having spectral response adjustment structures based on illuminant information, light level information, and image sensor settings in accordance with an embodiment of the present invention.

FIG. 13 is a flow chart of illustrative steps involved in determining a color correction matrix using a multivariate optimization process that optimizes overall image quality.

At step 500, processing circuitry 18 may determine illuminant information and light level information. Processing circuitry 18 may determine illuminant information for an image frame based on image statistics (e.g., based on image statistics provided from image processor 18B to decision center 18A of FIG. 11). For example, a capture illuminant may be estimated based on the white balance gains that are inferred as part of image processing. This is, however, merely illustrative. If desired, a capture illuminant may be estimated by other suitable means (e.g., using other types of image statistics, information from separate ambient light sensors, etc.). An inferred light level may be determined based on metadata (e.g., based on metadata provided from camera controller 18C to decision center 18A of FIG. 11).

At step 502, processing circuitry 18 may generate a CCM based on the illuminant information, light level information, and image sensor settings (e.g., based on an amount by which structures 30 adjust the spectral response of broadband pixels 190C). In configurations where spectral response adjustment structures 30 are formed from photochromic material, the state of the photochromic material may be determined based on image data from one or more previous image frames (e.g., based on an average of previous frames), may be determined based on a change in light level, may be determined based on whether or not illumination levels fall above or below an illumination threshold, etc. In configurations where spectral response adjustment structures 30 are formed from electrochromic elements, the state of the electrochromic elements may be determined based on the voltages applied to the electrodes in the electrochromic elements.

If desired, processing circuitry 18 may use one or more look-up tables or equations to determine the values in the CCM. The look-up procedure may be analogous to that of step 402 of FIG. 12 but may be of higher complexity, using the results of a multivariate optimization that balances degradations associated with noise, color inaccuracy, motion artifacts, chromatic artifacts, and other image quality factors. In addition to generating a CCM for the imaging device, processing circuitry 18 may also generate image sensor settings that optimize overall image quality.

Figure 14:
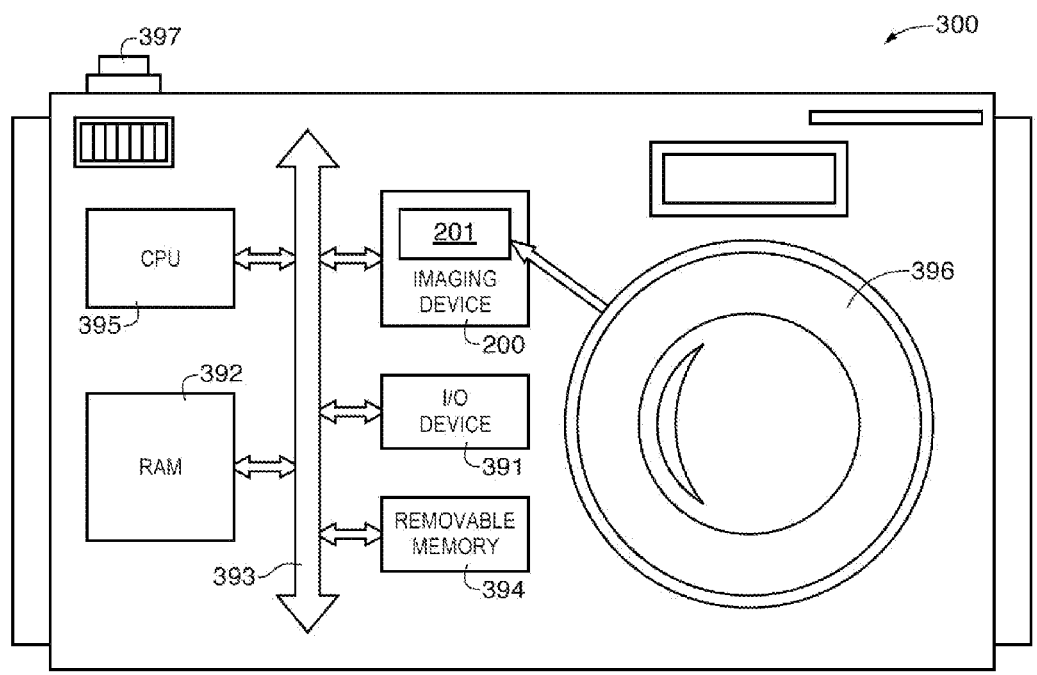
FIG. 14 is a block diagram of a system employing the embodiments of FIGS. 1-12 in accordance with an embodiment of the present invention.

FIG. 14 shows in simplified form a typical processor system 300, such as a digital camera, which includes an imaging device 200. Imaging device 200 may include a pixel array 201 (e.g., a pixel array such as pixel array 201 of FIG. 1 having spectral response adjustment structures 30). Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating imaging systems having image sensors with pixel arrays that include spectral response adjustment structures.

In one suitable embodiment, spectral response adjustment structures are formed from photochromic materials with spectral characteristics that change in response to incident light. The photochromic materials may be configured to transition from clear to gray or from clear to green in response to high light levels.

The photochromic materials may be incorporated into color filter elements in a color filter array, may be formed above color filter elements in a color filter array, may be formed below color filter elements in a color filter array, may be formed as a contiguous layer below a color filter array, or may be incorporated into microlenses in a microlens array. In high light conditions, photochromic material may reduce the total transmission of light through the photochromic material, or may only suppress the transmission of red and blue light.

In another suitable embodiment, spectral response adjustment structures are formed from electrochromic elements with spectral characteristics that change in response to changes in the electrical environment. The electrochromic elements may include an ion-conducting electrolyte sandwiched between upper and lower electrodes. A chromophore-containing film may be formed at one electrode, and an ion-donating film may be formed at the other electrode. Image sensor circuitry may apply a voltage between the upper and lower electrodes to instigate an ionic transfer between the ionic donor film and the chromophore. This causes changes in the band gap between the highest occupied and the lowest occupied molecular orbital gap of the chromophore, resulting in a spectral shift.

The electrochromic elements may be formed under the color filter array and/or may have elements that form part of the color filter array. For example, the chromophore may be combined with color filter elements in the color filter array (e.g., to form a chromophore-laced color filter element).

Processing circuitry in the imaging device may adjust the CCM based on the state of spectral response structures (e.g., based on an amount by which the spectral response of one or more pixels is adjusted using the spectral response adjustment structures). The CCM may be determined using a multivariate optimization process that balances degradations associated with noise, color inaccuracy, motion artifacts, chromatic artifacts, and other image quality factors.

The foregoing is merely illustrative of the principles of this invention which can be practiced in other embodiments.

What is claimed is:

1. An image sensor, comprising:
    an image pixel array having a first group of image pixels and a second group of image pixels; and
    spectral response adjustment structures in the first group of image pixels, wherein the spectral response adjustment structures are configured to adjust a spectral response of each image pixel in the first group of image pixels during operation of the image sensor, wherein the spectral response adjustment structures transition between a first spectral response in which the first group of image pixels transmit two or more colors of light and a second spectral response in which the first group of image pixels transmit only one color of light.

2. The image sensor defined in claim 1 wherein the spectral response adjustment structures are configured to adjust the spectral response of each image pixel in the first group in response to information chosen from the group consisting of: image information, camera metadata information, environmental information, light level information, and user input information.

3. The image sensor defined in claim 1 wherein the first group of image pixels comprises broadband image pixels having broadband color filter elements and wherein the second group of image pixels comprises red and blue image pixels having red and blue color filter elements.

4. The image sensor defined in claim 3 wherein the broadband color filter elements are configured to pass at least two colors of light selected from the group consisting of: red light, green light, and blue light.

5. The image sensor defined in claim 3 wherein the spectral response adjustment structures comprise photochromic material.

6. The image sensor defined in claim 5 wherein the photochromic material is incorporated into the broadband color filter element of each broadband pixel.

7. The image sensor defined in claim 5 wherein the photochromic material is formed above the broadband color filter element of each broadband pixel.

8. The image sensor defined in claim 5 wherein the photochromic material is formed below the broadband color filter element of each broadband pixel.

9. The image sensor defined in claim 8 wherein the broadband color filter elements, the red color filter elements, and the blue color filter elements form a color filter array that spans the image pixel array and wherein the photochromic material forms a contiguous layer below the color filter array.

10. The image sensor defined in claim 5 wherein the image pixel array comprises an array of microlenses, wherein each microlens in the array of microlenses covers a respective one of the broadband, red, and blue color filter elements, and wherein the photochromic material is incorporated into each microlens that covers a respective one of the broadband color filter elements.

11. The image sensor defined in claim 1 further comprising additional spectral response adjustment structures in the second group of image pixels, wherein the additional spectral response adjustment structures are configured to adjust a spectral response of each image pixel in the second group of image pixels during operation of the image sensor.

12. An image sensor, comprising:
    a substrate;
    an array of image pixels formed in the substrate, wherein the array of image pixels includes first and second groups of image pixels and comprises a color filter array; and
    spectral response adjustment structures adjacent to the color filter array, wherein the spectral response adjustment structures are configured to adjust respective spectral responses of image pixels in the first group of image pixels, and wherein the spectral response adjustment structures transition between a first spectral response in which the first group of image pixels transmit two or more colors of light and a second spectral response in which the first group of image pixels transmit only one color of light.

13. The image sensor defined in claim 12 wherein the spectral response adjustment structures comprise electrochromic elements.

14. The image sensor defined in claim 13 wherein the electrochromic elements comprise an ion-conducting electrolyte interposed between first and second electrodes.

15. The image sensor defined in claim 14 wherein the electrochromic elements further comprise:
    an ion-donating film interposed between the first electrode and the ion-conducting electrolyte; and
    a chromophore interposed between the second electrode and the ion-conducting electrolyte.

16. The image sensor defined in claim 13 wherein electrochromic elements comprise a chromophore interposed between the color filter array and the substrate.

17. The image sensor defined in claim 13 wherein the color filter array comprises a plurality of color filter elements and wherein the electrochromic elements comprise a chromophore incorporated into the color filter elements.

18. The image sensor defined in claim 13 wherein electrochromic elements comprise first and second electrodes and wherein the electrochromic elements are configured to adjust the respective spectral responses of the image pixels in the first group in response to an applied voltage between the first and second electrodes.

19. The image sensor defined in claim 18 wherein the substrate has a surface on which the array of image pixels is formed, wherein the first and second electrodes are oriented vertically with respect to the surface, wherein the color filter array comprises a plurality of color filter elements, and wherein at least one of the color filter elements is interposed between the first and second electrodes.

20. A method for operating an imaging device having an image sensor and processing circuitry, wherein the image sensor comprises an image pixel array having spectral response adjustment structures that are configured to adjust a spectral response of at least one image pixel in the image pixel array, the method comprising:
    with the processing circuitry, determining illuminant information and light level information for an image;
    with the processing circuitry, determining a state of the spectral response adjustment structures; and
    with the processing circuitry, generating a color correction matrix for the image based on the illuminant information, the light level information, and the state of the spectral response adjustment structures.

21. The method defined in claim 20 wherein generating the color correction matrix comprises balancing a plurality of attributes of image quality and wherein at least two of the attributes are chosen from the group consisting of: noise, color accuracy, chromatic artifacts, and motion artifacts.

22. The method defined in claim 21 wherein the spectral response adjustment structures comprise electrochromic elements having first and second electrodes and wherein determining the state of the spectral response adjustment structures comprises determining an applied voltage between the first and second electrodes.

23. The method defined in claim 21 wherein the spectral response adjustment structures comprise a photochromic material and wherein determining the state of the spectral response adjustment structures comprises determining spectral characteristics of the photochromic material based on information chosen from the group consisting of: image information, camera metadata information, and the light level information.

* * * * *